United States Patent
Komurasaki et al.

(10) Patent No.: US 6,642,540 B2
(45) Date of Patent: Nov. 4, 2003

(54) SEMICONDUCTOR INTEGRATED CIRCUIT DEVICE

(75) Inventors: Hiroshi Komurasaki, Tokyo (JP); Kazuya Yamamoto, Tokyo (JP); Hisayasu Satoh, Tokyo (JP); Hideyuki Wakada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/193,150

(22) Filed: Jul. 12, 2002

(65) Prior Publication Data

US 2003/0141501 A1 Jul. 31, 2003

(30) Foreign Application Priority Data

Jan. 30, 2002 (JP) ........................................ 2002-022245

(51) Int. Cl.⁷ .............................................. H01L 29/40
(52) U.S. Cl. .......................... 257/44; 257/347; 257/506; 257/531
(58) Field of Search .......................... 257/44, 347, 506, 257/531

(56) References Cited

U.S. PATENT DOCUMENTS

| 4,858,184 A | * | 8/1989 | Homma et al. | ............. | 365/174 |
| 6,225,674 B1 | * | 5/2001 | Lim et al. | ................... | 257/506 |
| 6,452,249 B1 | * | 9/2002 | Maeda et al. | ................ | 257/531 |

FOREIGN PATENT DOCUMENTS

| JP | 11-168100 | * | 6/1999 | ....... | H01L/21/3205 |
| JP | 2000-223584 | | 8/2000 | | |
| JP | 2000-299319 | | 10/2000 | | |

OTHER PUBLICATIONS

A. Rofougaran, et al., "A 1 GHz CMOS RF Front–End IC for a Direct–Conversion Wireless Receiver", IEEE Journal of Solid–State Circuits, vol. 31, No. 7, Jul. 1996, pp. 880–889.

C.P. Yue, et al., "On–Chip Spiral Inductors with Patterned Ground Shields for Si–Based RF IC's", IEEE Journal of Solid–State Circuits, vol. 33, No. 5, May 1998, 1998, pp. 743–752.

R. Fujimoto, et al., "High–Frequency Device–Modeling Techniques for FR–CMOS Circuits", IEICE Trans. Fundamentals, vol. E84–A, No. 2, Feb. 200, pp. 520–528.

A. Chatterjee, et al., "On Shallow Trench Isolation for Deep Submission CMOS Technologies", Extended Abstracts of the 1998 International Conference on Solid State Device and Materials, A–8–1, 1998, pp. 288–289.

* cited by examiner

*Primary Examiner*—David Nelms
*Assistant Examiner*—Dao H. Nguyen
(74) *Attorney, Agent, or Firm*—Burns, Doane, Swecker & Mathis, LLP

(57) ABSTRACT

A semiconductor device is arranged by having a shield/planarization portion including a silicided active region formed on the main surface of a semiconductor substrate and a non-active region provided by device-isolation on the surface, and a metal layer such as a pad, wiring layer or inductor having a predetermined pattern, formed on an interlayer insulation film formed on the above shield/planarization portion. Just under the metal layer is disposed the shield/planarization portion in which the area ratio of the active region to the non-active region is given in a predetermined proportion and the active region is electrically grounded.

15 Claims, 8 Drawing Sheets

FIG.5
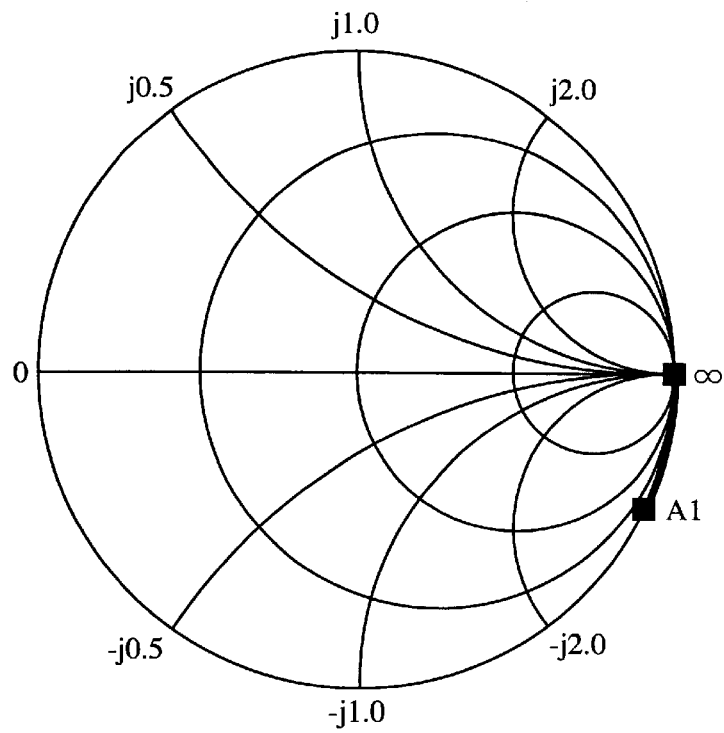
FIG.6
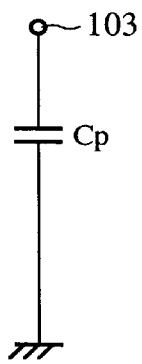
FIG.7
|  | ALLOVER SHIELD PAD FORMED FROM LOWER LAYER ALUMINUM | SHIELD PAD FORMED FROM A MESH-SHAPED ACTIVE REGION |
|---|---|---|
| Csub | 0.18pF | 0.07pF |

US 6,642,540 B2

SEMICONDUCTOR INTEGRATED CIRCUIT DEVICE

BACKGROUND OF THE INVENTION

1. Field of the Invention

The present invention relates to a semiconductor integrated circuit device, and more particularly relates to a semiconductor integrated circuit device in which the loss of a high frequency signal in a signal line or spiral inductor thereof formed with a pad and metal is to be reduced.

2. Description of the Prior Art

In recent years, the remarkably wide use of cellular phones has rapidly increased the demand for semiconductor devices. The wide use functionally demands semiconductor devices that can operate also in the high frequency region. The development of technology which is directed to the reduction of the signal loss in the input/output port of the semiconductor device is proceeding in order to meet the demand. As such a prior art, a typical pad structure in CMOS technology is described in (R. Fujimoto, O. Watanabe, F. Fuji, H. Kawakita, and H. Tanimoto, "High-Frequency Device-Modeling Technique for RF-CMOS Circuits," IEICE Trans. Fundamentals., vol. E84-A, no. 2, pp. 520–528, February 2001).

FIG. 10A is a plan view showing the pad structure used for the input/output port of the conventional semiconductor integrated circuit device. FIG. 10B is a sectional view taken along the line E—E. Referring to the Figures, the reference numeral 100 designates a silicon substrate, the numeral 102 designates an interlayer insulation film made, of oxide film, the numeral 103 designates a pad made of a metal layer, and the numeral 104 designates an device-isolation made of oxide film, abbreviated as STI (Shallow Trench Isolation).

The operation will next be described below.

Formation of a pad 103 by use of metal (metal layer) on the insulation film 102 and the device-isolation 104 formed over the silicon substrate 100 forms parasitic capacitance Cp with the device-isolation 104 and the insulation film 102 as an interlayer film, and the formation develops the resistance component Rsub of the silicon substrate 100 in series with the parasitic capacitance Cp. In the device, when a high frequency signal is applied on the pad, the parasitic resistance Rsub in the resistance components thereof can become a factor of the signal loss and the heat noise.

FIG. 11 is a plan view showing another pad structure of a conventional semiconductor integrated circuit device. The figure illustrates a pad used for the input/output port of a semiconductor device in the recent semiconductor microfabrication process. The structure of FIG. 11 differs from that of FIG. 10A and FIG. 10B in that an active region 106 in the transistor structure is disposed also right under the metal of the pad 103. The active region 106 becomes a dummy active region in contrast to active elements such as transistors used for the circuit located in close vicinity to the pad.

In other words, the dummy active region has the job of increasing the planarity (flatness) of the area very close to the pad when planarizing the surface of the substrate by means of CMP (Chemical and Mechanical Polishing). Thereby, finished quality consistency from transistor to transistor disposed adjacent to the dummy active region improves. The planarization of the semiconductor substrate is described in the following conventional example (see A. Chatterjee, M. Nandakumar, S. Ashburn, V. Gupta, P. Kwok, and I.-C. Chen "On Shallow Trench Isolation for Deep Submission CMOS Technologies," Extended Abstracts of the International Conference on Solid State Devices and Materials, A-8-1, pp. 288–289, 1998).

A model circuit shown in lumped constants corresponding to the conventional pad structure will next be shown in FIG. 12. Referring to FIG. 12, Cp shows a parasitic capacitance caused between metal constituting the pad and silicon substrate, and Rsub and Csub show a resistance component and a parasitic capacitance of the silicon substrate, respectively. In this model circuit, the resistance component Rsub is a factor of the signal loss. When a high frequency signal is applied on the pad, the parasitic resistance loses the signal.

Since the conventional semiconductor integrated circuit device is arranged as mentioned above, in most cases a floating active region exists or never exists just under the metal layer of the pad or wiring. There has been a drawback that the loss of the signal is larger in a high-frequency region because of the existence of the parasitic resistance component Rsub caused by the metal layer in the equivalent circuit.

SUMMARY OF THE INVENTION

The present invention has been accomplished to solve the above-mentioned problem. An object of the present invention is to provide a semiconductor integrated circuit device in which the signal loss is reduced in a signal line or spiral inductor formed by a pad or metal in a high-frequency region, and the CMP planarity in the semiconductor microfabrication process is improved.

According to a first aspect of the present invention, there is provided a semiconductor integrated circuit device including: a semiconductor substrate including a silicided active region formed on the main surface thereof and a non-active region provided by device-isolation on the same surface; an interlayer insulation film formed on the substrate; and a conductor pad formed in a predetermined-patterned shape on the insulation film, wherein a shield/planarization portion in which the area ratio of the active region to the non-active region is given in a predetermined proportion and the active region is electrically grounded is disposed between the semiconductor substrate and the insulation film just under the pad.

Thus, the CMP planarity is increased by means of properly selecting the area ratio and further the parasitic resistance component Rsub of the substrate can be minimized by means of ground-shielding the active region. Therefore, the consistency in the completed quality of the transistors located around the pad and further the signal loss is reduced when applying the high frequency signal on the pad.

According to a second aspect of the present invention, there is provided a semiconductor integrated circuit device including: a semiconductor substrate including a silicided active region formed on the main surface thereof and a non-active region provided by device-isolation on the same surface; an interlayer insulation film formed on the substrate; and a conductor wiring layer formed in a predetermined-patterned shape on the insulation film, wherein a shield/planarization portion in which the area ratio of the active region to the non-active region is given in a predetermined proportion and the active region is electrically grounded is disposed between the semiconductor substrate and the insulation film just under the wiring layer.

Thus, the proper selection of the area ratio can increase the CMP planarity and further the ground shield of the active region can minimize the parasitic resistance component of the substrate. Therefore, the consistency in the completed quality of the transistors located around the wiring layer can be increased and the signal loss can be reduced when applying a high frequency signal on the wiring layer.

According to a third aspect of the present invention, there is provided a semiconductor integrated circuit device including: a semiconductor substrate including a silicided active region formed on the main surface thereof and a non-active region provided by device-isolation on the same surface; an interlayer insulation film formed on the substrate; and a conductor inductor formed in a predetermined-patterned shape on the insulation film, wherein a shield/planarization portion in which the area ratio of the active region to the non-active region is given in a predetermined proportion and the active region is electrically grounded is disposed between the semiconductor substrate and the insulation film just under the inductor.

Thus, the proper selection of the area ratio can increase the CMP planarity and further the ground shield of the active region can minimize the parasitic resistance component of the substrate. Therefore, the consistency in the completed quality of the transistors located around the wiring layer can be increased and the signal loss can be reduced when applying a high frequency signal on the wiring layer.

BRIEF DESCRIPTION OF THE DRAWINGS

FIG. 1A is a plan view of the configuration, and FIG. 1B is a sectional view taken along the line A—A;

FIG. 4A is a plan view of the configuration, and FIG. 4B is a sectional view taken along the line B—B;

FIG. 5 is a Smith chart showing the measured result of S parameters of the pad for explanation of the embodiment 1 according to the present invention;

FIG. 6 is an equivalent circuit diagram of the model of the pad for explanation of the embodiment 1 of the present invention;

FIG. 7 is a table showing the sampled result of the parameter of the equivalent circuit of the model of the pad for explanation of the embodiment 1 of the present invention;

FIG. 8B is a plan view of the configuration, and FIG. 8B is a sectional view taken along the line C—C;

FIG. 9A is a plan view of the configuration, and FIG. 9B is a sectional view taken along the line D—D;

FIG. 10A is a plan view of the configuration, and FIG. 10B is a sectional view taken along the line E—E;

DETAILED DESCRIPTION OF THE PREFERRED EMBODIMENTS

An embodiment of the present invention will be described below.

EMBODIMENT 1

Figure 1A:
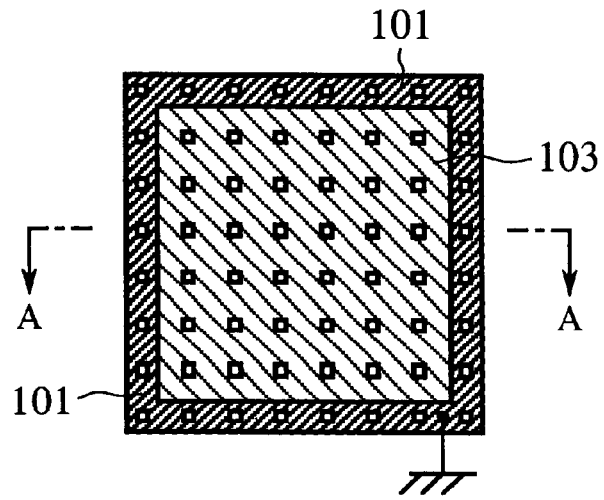
FIGS. 1A and 1B show a pad configuration of the semiconductor integrated circuit device according to an embodiment 1 of the present invention.
Figure 1B:
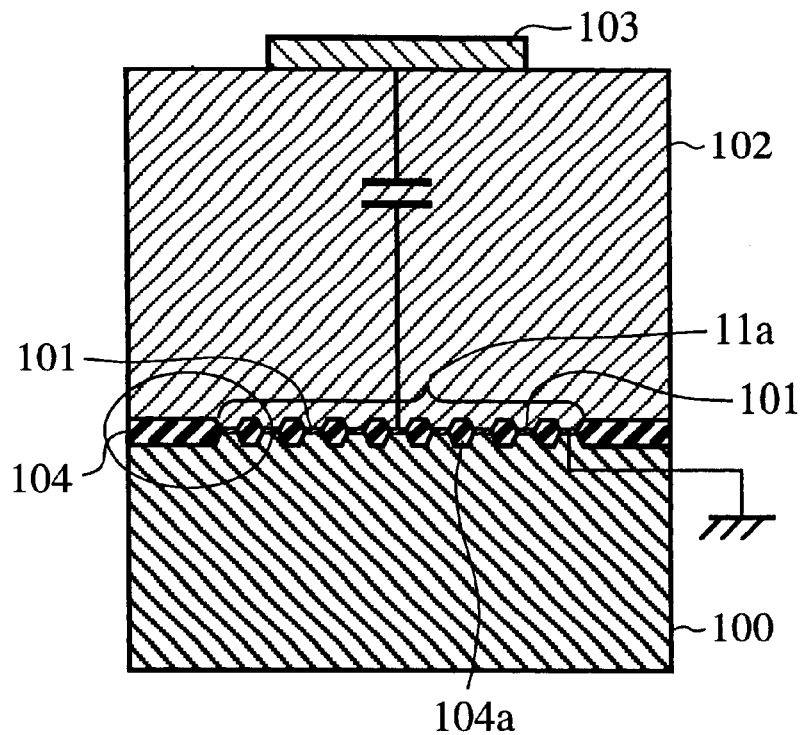
Figure 2:
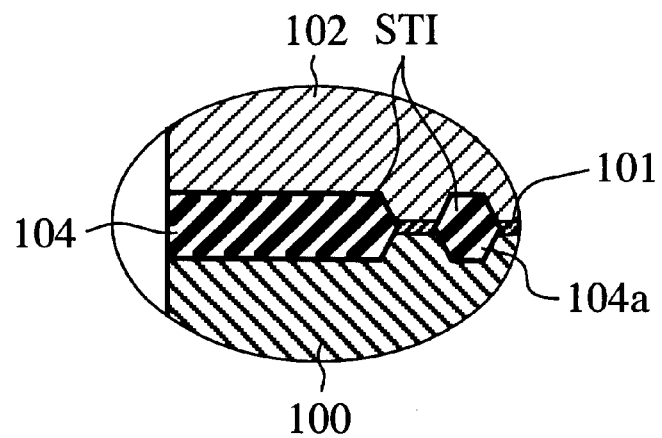
FIG. 2 is a partially enlarged view of FIG. 1B.

FIG. 1A is a plan view showing a pad configuration used for the input/output port of the semiconductor integrated circuit device according to an embodiment 1 of the present invention, and FIG. 1B is a sectional view taken along the line A—A. Referring to the figures, the reference numeral 100 designates a silicon substrate, the numeral 101 designates a silicided active region having a mesh-shaped layout, the numeral 102 designates an interlayer insulation film made of oxide film, and the numeral 103 designates a pad that is made of metal layer and has a rectangular- or polygonal-patterned shape. The pad represents an electrode portion for use of the input/output port of the semiconductor integrated circuit device and connects the internal wiring of the semiconductor chip with the external. The pad 103 can have not only a polygonal patterned shape, but also a circular or elliptical patterned shape. The numeral 104 is an device isolation that is abbreviated as STI (Shallow Trench Isolation) and made of oxide film, and the numeral 104a constitutes a non-active region provided in a mesh-shaped layout arrangement within a shield/planarization portion described later. The reference numeral 11a designates a shield/planarization portion composed of the active region 101 and the non-active region 104. Examples of refractory metals used for forming the above silicided active region include Ti, Mo, Pt, and Ni and the like. FIG. 2 is a partially enlarged view of FIG. 1B. As is apparent from the drawings, the silicided active region 101 is provided between the device isolations 104. Thus, between the silicon substrate 100 and the interlayer insulation film 102 just under the pad 103, the active region 101 having a mesh-shaped layout is disposed in a proper proportion so that the CMP planarity may be improved (i.e., the effect of the dummy active region), at the area ratio of the active region 101 to the non-active region 104a corresponding to the lattice points of the active region. Moreover, since the silicided active region 101 is electrically grounded, to thereby serve as a shield, the silicided active region 101 constitutes the shield/planarization portion 11a.

Here, the optimization of the ratio of the active region 101 to the non-active region 104a depends on the application of the semiconductor device, and is subject to the following trade-off:

(1) It is preferable that the area of the active region is smaller than that of the non-active region, in order to use the obtained device in a higher frequency region, (2) The area of the active region 101 is within the range from 15% to 85% in the area located just or right under the pad 103, in order to increase the CMP planarity.

The decision of the range from 15% to 85% is based on the following reasons. Within the range, the CMP planarity can be maintained high even if a transistor having a gate length of 0.3 μm or less as its smallest gate size is formed in the vicinity of the pad 103; the active region thereby exerts its effect as the dummy active region and, as a result, the variations in the size of the surrounding transistors can be fallen in the allowable range. Therefore, the completed quality consistency of the transistors provided in the vicinity of the pad 103 can be improved.

Here, the CMP treatment will be briefly described. The CMP of the insulation film in the formation of the device isolation 104 by means of the above-mentioned STI method will next be discussed. In real LSIs, the density of patterns per unit area varies within a chip. The polishing characteristic of CMP depends on this density of patterns. That is, in separated or isolated patterns the polishing rate is high, while in close patterns the rate is low. In order to adjust the difference between the polishing rates, the dummy patterns should be suitably arranged to eliminate the influence of the density difference. It is the active region 101 serving as the dummy active region within the shield/planarization portion 11*a* according to the present invention that plays the aforementioned role.

The operation will next be described below.

Together with the non-active region 104*a* of the device isolation 104, the active region 101 which is silicided and has a mesh-shaped layout is provided as the shield/planarization portion 11*a*. The pad 103 is formed on the interlayer insulation film 102 formed on top thereof, and the active region 101 is electrically grounded. In such a device configuration, parasitic capacitance Cp is created due to the interlayer insulation film 102, and the resistance component Rsub of the silicon substrate is caused in series with this parasitic capacitance Cp. However, since the electrically grounded and silicided active region 101 serves as a shield, the resistance component Rsub of the substrate is minimized (Rsub→0, Rsub is almost zero.), to thereby become extremely invisible. Accordingly, even if a high frequency signal is applied on the pad 103, the signal loss is reduced because the silicided active region 101 serves as a ground shield.

The resistance component of the silicided active region 101 can be neglected because its own resistance is small (10Ω/ 58 or less) . Moreover, the disposition of the active region 101 in a mesh-shaped layout adjusts the area rate of the active region 101 to the non-active region 104*a* in the shield/planarization portion 11*a*, to the suitable rate increasing the planarity brought about by the CMP process. Thereby, it becomes possible to reduce the influence on the circuit, especially the transistors in the vicinity of the pad 103.

Figure 3:
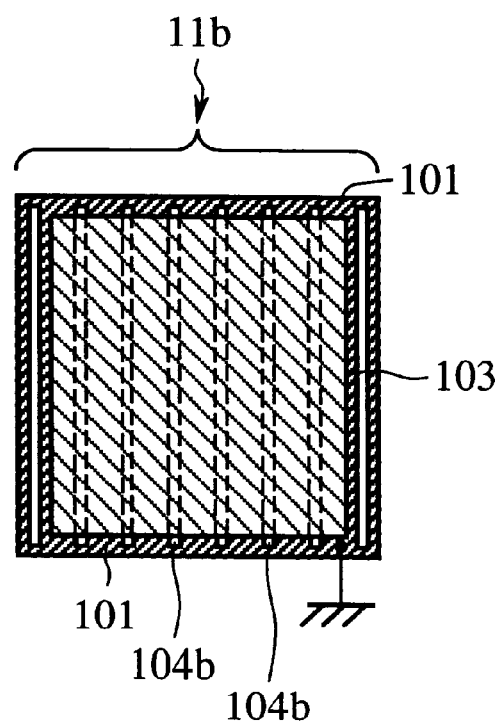
FIG. 3 is a plan view showing another pad configuration according to the embodiment 1 of the present invention.

Here, it is not essential that the active region 101 is disposed in a mesh shaped layout. It is important that "the area ratio of the active region 101 to the non-active region 104*a* is adjusted to an appropriate ratio." That is, for instance, FIG. 3 is a view showing another pad configuration according to the embodiment 1 of the present invention. Because the layout can have a stripe shape, there is no problem in the configuration. Other layouts can also have the similar effect, if the layouts fall within the range in which "the area ratio of the active region 101 to the non-active region 104*b* is appropriate," that is, in the range in which the area of the active region 101 is within the range of 15%–85% of the area of the region located just under the pad 103.

Figure 4A:
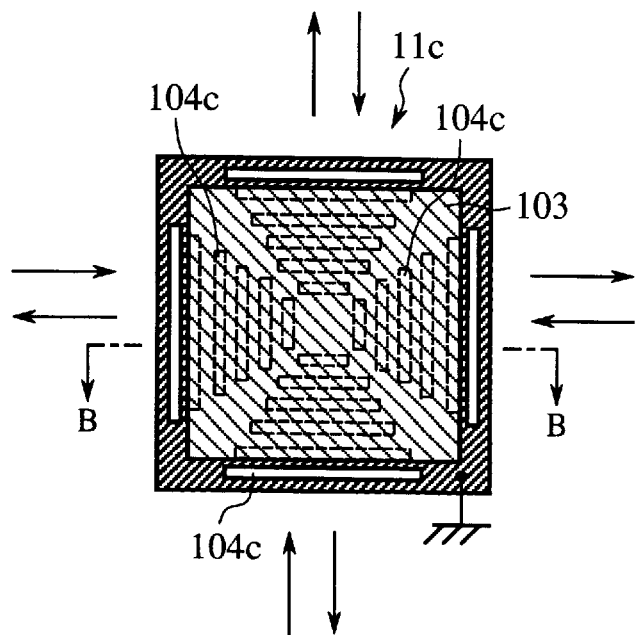
FIGS. 4A and 4B show the configuration of a modified example of the pad according to Embodiment 1 of the present invention.
Figure 4B:
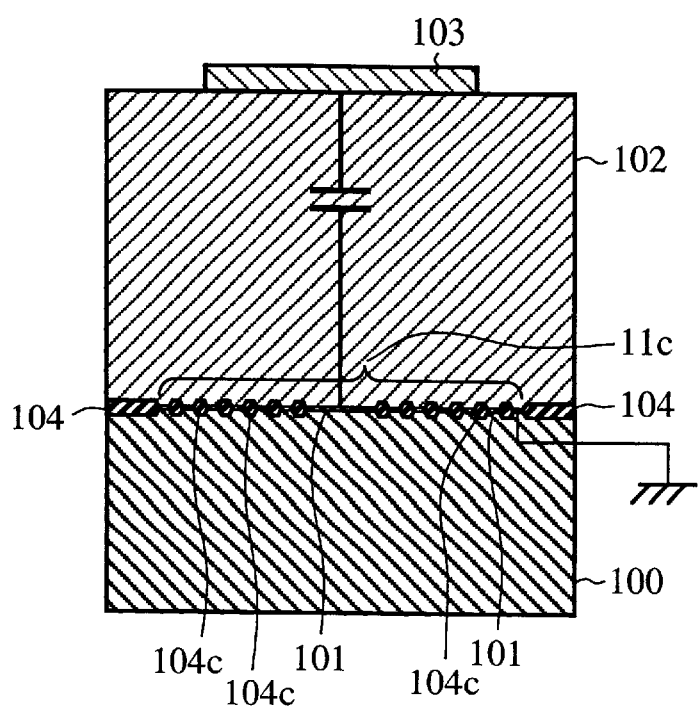

The pad configuration of a modified example of the embodiment 1 will next be shown in FIG. 4A and FIG. 4B. FIG. 4A is a plan view showing the configuration, and FIG. 4B is a sectional view thereof taken along the line B—B. Referring to the figures, the reference numeral 11*c* is a shield/planarization portion, and the numeral 104*c* is a non-active region made of device isolation 104 having a rectangular or striped pattern. The feature of layout of the non-active region 104*c* is that a plurality of non-active regions 104*c* are disposed parallel to each other along each side of the pad 103 and the pattern size of the non-active region is radially determined from the center of the pad toward each side of the pad. Here, any one of each side of the pad 103 is to be connected with a wiring leading to the internal circuit. In FIG. 4A, the shield/planarization portion has a horn shape in which the size of the stripe-shaped pattern (non-active region) 104*c* longitudinally increases as the pattern is disposed closer to the side of the pad 103 from the center thereof.

The pad configuration of this modified example can reduce the signal loss caused when a high frequency signal is applied to the pad as explained above, and thereby render the loosened influence to be exerted on the surrounding transistors. In addition, the pad configuration of this modified example has an advantage that the occurrence of a mirror image current causing the signal loss reduces due to the following reason. The adoption of the layout in which the plurality of rectangular patterns of the non-active region 104*c* are radially arranged from the center of the pad toward outside disposes the shield/planarization portion 11*c* vertically to the flow of the signal produced when the signal is input and output (practically, the signal does not flow in all the four directions shown in the figure with the arrows, but flows in only one direction.). This case shows the layout of the device isolation 104 in which the size of the stripe-shaped pattern increases toward each side of the pad. However, the mere disposition of the patterns parallel to each other can reduce the occurrence of the mirror image current.

FIG. 5 is a Smith chart shown by S parameter measured in the range of 100 MHz to 10 GHz when an electrically grounded mesh-shaped active region 101 is disposed just under the metal of the pad 103. Smith's plotting in this Smith chart is equivalent to obtaining the reflection coefficient. The right half of the impedance (Z) plane falls on a circle with radius 1 (Z is normalized impedance=impedance/50Ω). As is apparent from the chart, the values of S parameter are shown as the thick line, stuck on the outer frame of the Smith chart, which represents a state in which the values of S parameter have only an imaginary part of a complex number and do not have a real part thereof. That is, as is apparent from these results, the device has an excellent characteristic where only the capacitance component Cp is visible. Such pad 103 having only the capacitance component is useful for the output port of the high frequency signal, which is well matched to an impedance of 50-ohm and the like.

The S parameter will now be shortly described below. The description of the circuit characteristic in a general electric circuit or electronic circuit uses Z parameters, Y parameters, and h parameters. These parameters are primarily used for measuring and evaluating the circuit characteristic within a low frequency voltage/current region. It is impossible to measure the voltage and current in a high frequency region by use of these parameters. For this reason, attention is focused on the electric power that can be accurately measured with stability even in a high frequency region. That is, attention is directed toward the relationship between the electric power entering the circuit (the input wave "an") and the electric power going out from the circuit (the output wave "bn"), and on the other hand the circuit network is handled as a black box. It is S matrix (scattering matrix) that specifies the characteristic of the circuit based on the size and the phase of the wave relating to the electric power which enters and outgoes via each terminal pair (port) of the circuit. Each element of S matrix is referred to as a S parameter. The "an" and "bn" each designate a complex quantity and have a dimension and a phase. For instance, because S matrix is specified by use of the characteristic impedance ZO of each port, the value of S parameter changes if the ZO is changed.

In addition, as shown in the embodiment 1, the shielding by means of the active region 101 reduces the parasitic capacitance Cp of the pad 103 caused in this interlayer insulation film 102, as compared with a case in which the shield is done by a metal layer located below the metal constituting the pad 103 since the thickness of the interlayer insulation film 102 forming the capacitance increases. Moreover, the parasitic capacitance Cp can be further reduced when the area of the active region 101 is further reduced.

Figure 12:
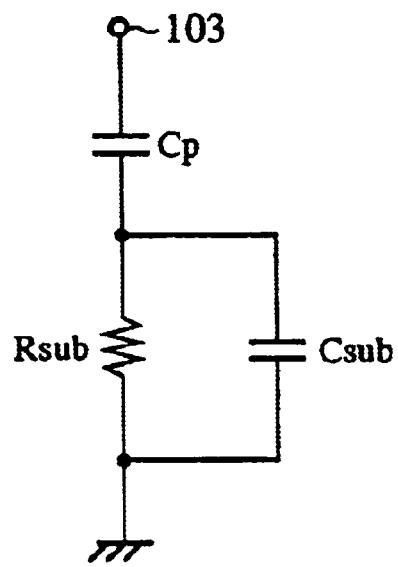
FIG. 12 is an equivalent circuit diagram of the model of the pad for explanation of the conventional semiconductor integrated circuit device.

FIG. 6 illustrates a model circuit which models the shielded pad 103 by a lumped parameter circuit. The model circuit does not cause a substrate parasitic element Csub of the silicon substrate 100, as is different from the conventional circuit shown in FIG. 12. In the table of FIG. 7, with respect to the parasitic capacitance Cp of this model, the parameter-sampled results by use of S parameter really measured in the range from 100 MHz to 10 GHz are shown by comparing the shield pad formed by use of an allover lower-layer metal and the shield pad formed by use of the mesh-shaped active region. As is apparent from the table, the substrate parasitic capacitance Csub (0.07 pF) of the shield pad formed by the mesh-shaped active region is less than half that (0.18 pF) of the shield pad formed by the allover lower-layer metal. Since a circuit having a smaller parasitic capacitance Csub generally has higher impedance in a high frequency region as well, there is an advantage to be properly employed for a circuit-capable of operating at high speed.

As mentioned above, according to the embodiment 1, the electrical ground of the silicided active region 101 included in the shield/planarization portion 11a–11c can minimize the substrate resistance component Rsub, thereby reducing the loss of a high frequency signal. Moreover, when the active region 101 is arranged in a mesh-shaped layout, or the non-active region is arranged in a stripe-shaped layout, the area ratio of the active region 101 to the non-active regions 104a–104c can be optimized in relation to the CMP planarity. In such a way, the size variations of the transistors adjacent to the pad 103 can be reduced and the consistency in the completed quality of the transistors surrounding the pad can be increased.

In addition, the occurrence of the mirror image current can be reduced when the signal is input and output between the internal circuit and the outside through the pad 103 since a plurality of device-isolations 104c with a rectangular pattern are laid out parallel to each other along each side of the pad 103 having a rectangular pattern and radially from the center of the pad toward each side thereof. Therefore, the signal loss of the high-frequency signal can be reduced.

EMBODIMENT 2

Figure 8A:
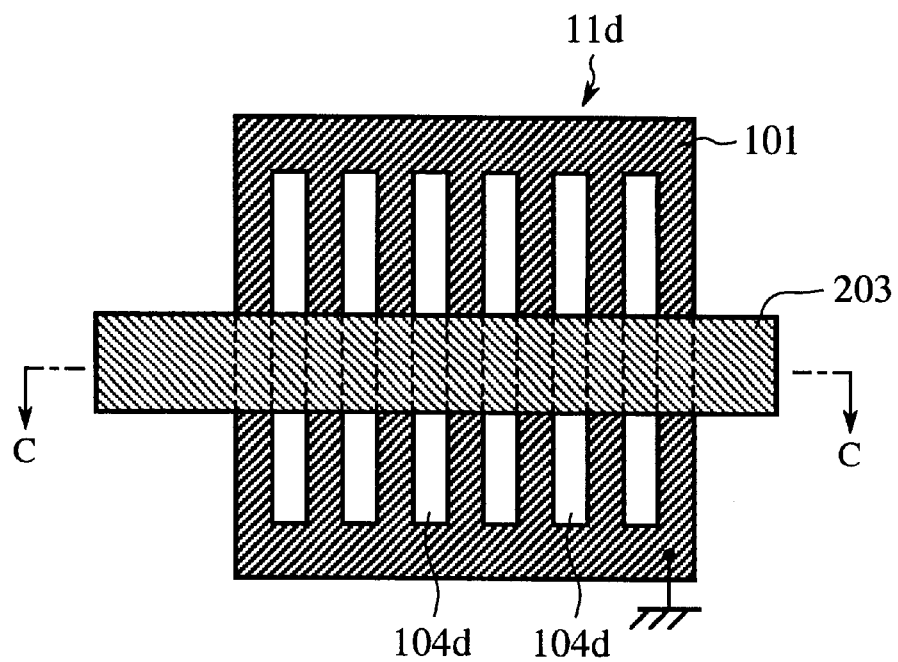
FIGS. 8A and 8B show a signal line configuration of the semiconductor integrated circuit device according to an embodiment 2 of the present invention.
Figure 8B:
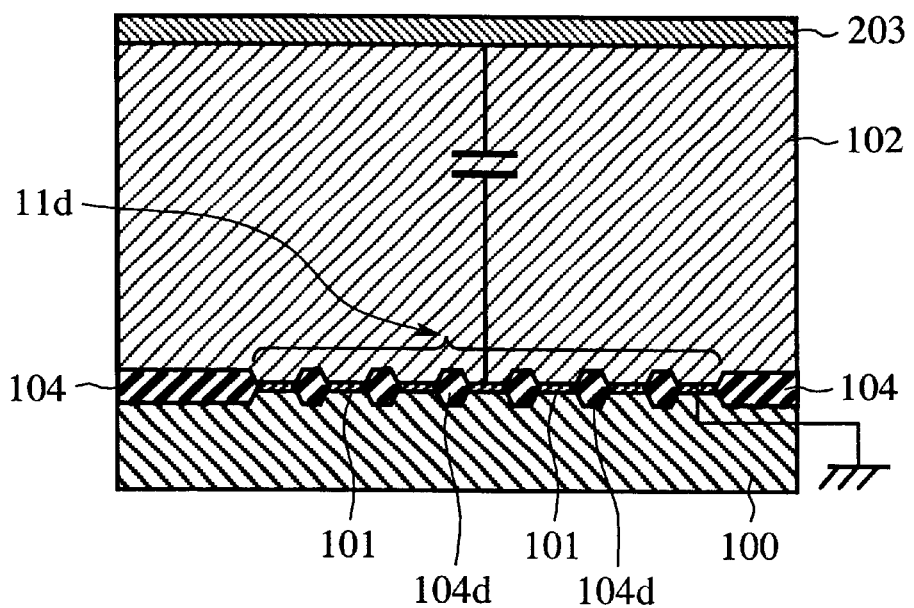

FIG. 8A is a plan view showing a wiring line configuration in the semiconductor integrated circuit device according to an embodiment 2 of the present invention. FIG. 8B is a sectional view thereof taken along the line C—C. Referring to the figures, the reference numeral 100 designates a silicon substrate, the numeral 101 designates a silicided active region arranged in a stripe-shaped layout, the numeral 102 designates an interlayer insulation film made of oxide film, the numeral 203 designates a wiring layer which constitutes a signal line by metallization, the numeral 104 is an device-isolation called STI, and the numeral 104d disposed in a stripe-shaped layout arrangement and constituting a non-active region. The reference numeral 11d designates a shield/planarization portion composed of the active region 101 and the non-active region similarly to the above devices.

The embodiment 2 is a case in which the present invention is applied to a wiring layer 203 of the signal line. The device is arranged such that the CMP planarity is increased by means of disposing the active region 101 in a stripe-shape arrangement and reducing the area ratio of the active region 101 to the non-active region 104 in the shield/planarization portion 11d. Since the operation thereof is similar to that of the embodiment 1, the description will be omitted.

As mentioned above, according to the embodiment 2, similarly to the above embodiment 1, the effect of parasitic resistance component Rsub of the silicon substrate 100 is reduced and thereby the loss of the high frequency signal can be reduced. The above arrangement is particularly useful for the input/output port of the high frequency signal that is well matched to an impedance of 50-ohm or so.

EMBODIMENT 3

Figure 9A:
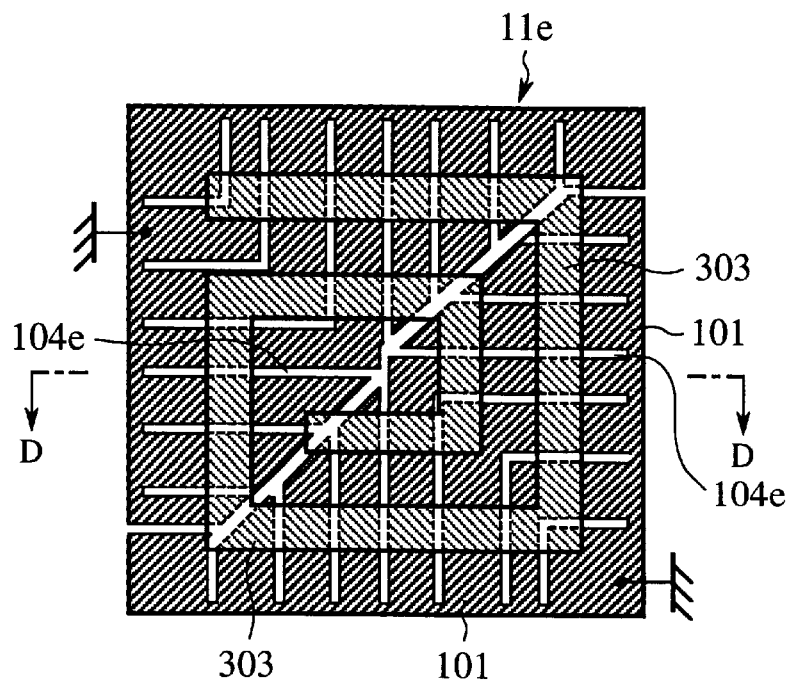
FIGS. 9A and 9B show a spiral inductor configuration of the semiconductor integrated circuit device according to an embodiment 3 of the present invention.
Figure 9B:
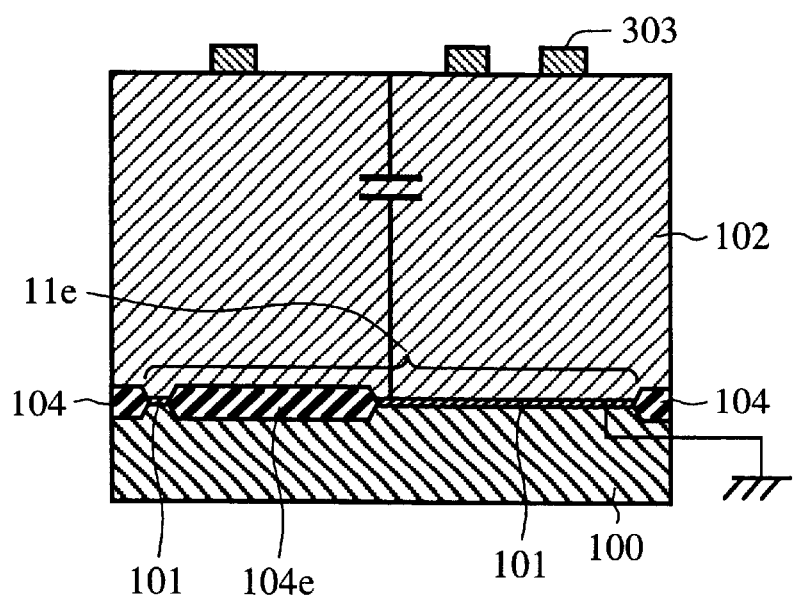
Figure 10A:
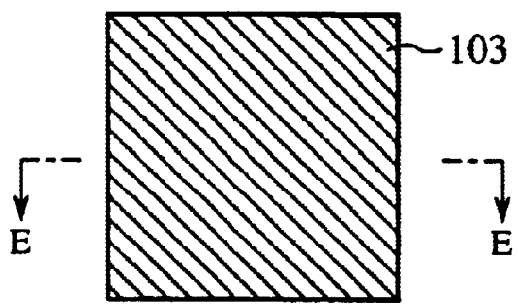
FIGS. 10A and 10B show a pad configuration in the conventional semiconductor integrated circuit device.
Figure 10B:
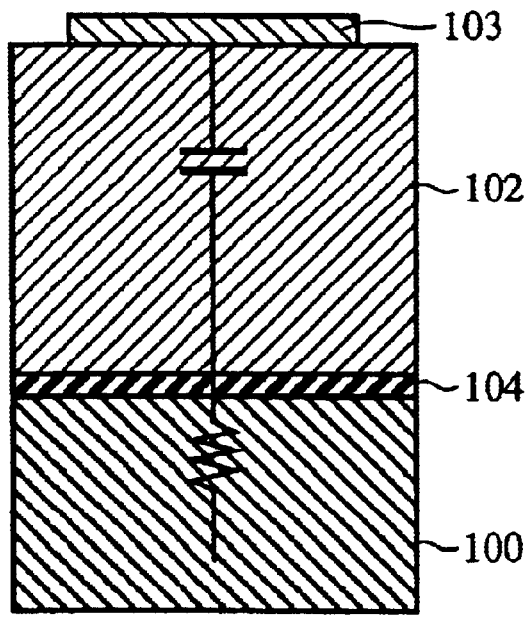
Figure 11:
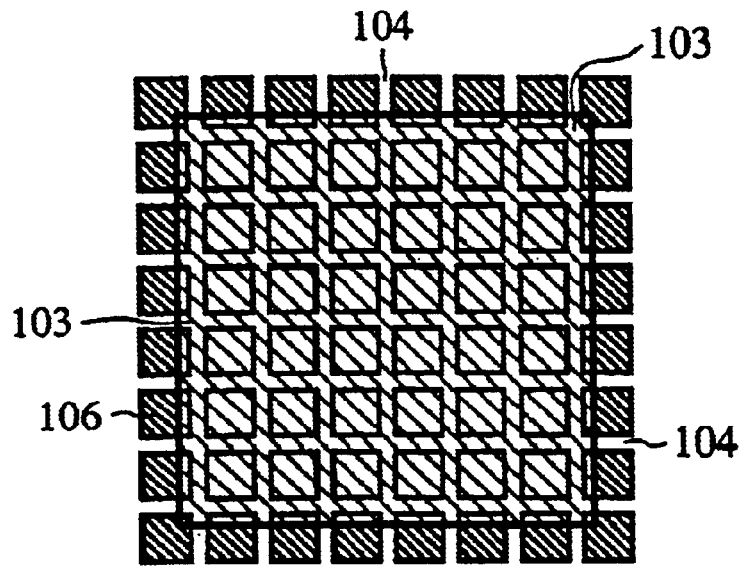
FIG. 11 is a plan view showing another pad configuration in a conventional semiconductor integrated circuit device.

FIG. 9A is a plan view showing a spiral inductor configuration of the semiconductor integrated circuit device according to an embodiment 3 of the present invention. FIG. 9B is a sectional view thereof taken along the line D—D. Referring to the figures, the numeral 104e designates a non-active region constituted by device-isolation 104, the numeral 303 designates a wiring layer constituting a spiral inductor by metallization, the numeral 11e designates a shield/planarization portion, and other constituent elements are the same as that of the above configuration. The description thereof is omitted.

The embodiment 3 is a case in which the present invention is applied to a spiral inductor formed of metal such as aluminum wiring or the like. The device is arranged such that a (silicided) active region 101 having a predetermined pattern shape referred to as a pattern shield is disposed between a silicon substrate 100 and an interlayer insulation film 102 just under a wiring layer 303 constituting the spiral inductor. A feature of the device is that the device is shielded by means of electrically grounding its active region 101.

The operation will next be described below.

When shielding the spiral inductor, a patterned shield is used since an allover shield generally deteriorates Q value of the inductor. Additionally, in the present invention, because a ground shield is provided by use of the silicided active region 101, parasitic capacitance Cp can be further reduced compared with a case in which the shield is provided by use of the lower layer metal. This is because the smaller the real part is, the smaller the Q value may be, where the Q value of the spiral inductor is presented in complex representation (an imaginary part/a real part). The smallness of the parasitic component can be an indicator representing how close to a pure inductor the spiral inductor is. Increasing the Q value is equivalent to reducing the loss of the high frequency signal since the parasitic real component is small.

Moreover, similarly to the above embodiments, the selection of the suitable area ratio of the active region 101 to the non-active region 104e in the shield/planarization portion lie (for instance, the area of the active region 101 falls within the range of 15%–85% of the area of the region located right under the wiring layer 303 constituting the spiral inductor) increases the CMP planarity in the region in the vicinity of the spiral inductor. Therefore, the consistency in the finished quality of the transistors that are adjacent to the spiral inductor may be improved.

As mentioned above, according to the embodiment 3, when ground-shielding the spiral inductor formed of aluminum wiring, the area ratio of the active region 101 to the non-active region 104e in the shield/planarization portion 11e is determined by use of the silicided active region 101 in consideration of the CMP planarity. Thereby, an influence to be exerted on active elements such as surrounding transistors in the vicinity of the spiral inductor can be reduced.

What is claimed is:

1. A semiconductor integrated circuit device comprising:
    a semiconductor substrate including a silicided active region formed on a main surface thereof and a non-active region provided by device-isolation on the same surface;
    an interlayer insulation film formed on the substrate; and
    a conductor pad formed in a predetermined-patterned shape on the insulation film,
    wherein a shield/planarization portion, in which an area ratio of the active region to the non-active region is given in a predetermined proportion and the active region is electrically grounded, is disposed between the semiconductor substrate and the insulation film just under the conductor pad, wherein the active and non-active regions are formed between device-isolations.

2. A semiconductor integrated circuit device according to claim 1, wherein the active region of the shield/planarization portion has a mesh-shaped layout.

3. A semiconductor integrated circuit device according to claim 1, wherein the pad is disposed in a predetermined shape, and the shield/planarization portion has a layout in which the non-active region composed of a plurality of stripe-shaped patterns is disposed with the patterns being parallel to each other.

4. A semiconductor integrated circuit device according to claim 3, wherein the plurality of stripe-shaped patterns located in the non-active region of the shield/planarization portion have a layout in which the patterns are disposed parallel to at least one side of the pad that is formed in a rectangular- or polygonal-patterned shape.

5. A semiconductor integrated circuit device according to claim 4, wherein the plurality of stripe-shaped patterns have a layout in which the plurality of stripe-shaped patterns are radially disposed from the center of the pad toward outside.

6. A semiconductor integrated circuit device according to claim 1, wherein in the predetermined proportion, the active region occupies 15%–85% of the area located just under the pad.

7. A semiconductor integrated circuit device according to claim 1 comprising a transistor having a gate length of 0.3 $\mu$m or less.

8. A semiconductor integrated circuit device comprising:
    a semiconductor substrate including a silicided active region formed on a main surface thereof and a non-active region provided by device-isolation on the same surface;
    an interlayer insulation film formed on the substrate; and
    a conductor wiring layer formed in a predetermined-patterned shape on the insulation film,
    wherein a shield/planarization portion, in which an area ratio of the active region to the non-active region is given in a predetermined proportion and the active region is electrically grounded, is disposed between the semiconductor substrate and the insulation film just under the conductor wiring layer, wherein the active and non-active regions are formed between device-isolations.

9. A semiconductor integrated circuit device according to claim 8, wherein the active region of the shield/planarization portion has a mesh-shaped layout.

10. A semiconductor integrated circuit device according to claim 8, wherein the non-active region of the shield/planarization portion has a stripe-shaped layout.

11. A semiconductor integrated circuit device according to claim 8, wherein the wiring layer disposed on the shield/planarization portion has a line-shaped pattern, and the non-active region of the shield/planarization portion has a layout in which a plurality of stripe-shaped patterns are disposed parallel to each other.

12. A semiconductor integrated circuit device according to claim 8, wherein in the predetermined proportion, the active region occupies 15%–85% of the area located right under the wiring layer.

13. A semiconductor integrated circuit device comprising:
    a semiconductor substrate including a silicided active region formed on a main surface thereof and a non-active region provided by device-isolation on the same surface;
    an interlayer insulation film formed on the substrate; and
    a conductor inductor formed in a predetermined-patterned shape on the insulation film,
    wherein a shield/planarization portion, in which an area ratio of the active region to the non-active region is given in a predetermined proportion and the active region is electrically grounded, is disposed between the semiconductor substrate and the insulation film just under the conductor inductor, wherein the active and non-active regions are formed between device-isolations.

14. A semiconductor integrated circuit device according to claim 13, wherein the active region included in the shield/planarization portion constitutes a patterned shield.

15. A semiconductor integrated circuit device according to claim 13, wherein in the predetermined proportion, the active region occupies 15%–85% of the area located right under the inductor.

* * * * *